US008890113B2

(12) United States Patent
Ledentsov et al.

(10) Patent No.: US 8,890,113 B2
(45) Date of Patent: Nov. 18, 2014

(54) OPTOELECTRONIC DEVICE WITH A WIDE BANDGAP AND METHOD OF MAKING SAME

(76) Inventors: Nikolay Ledentsov, Berlin (DE); James Lott, Berlin (DE); Vitaly Shchukin, Berlin (DE)

( * ) Notice: Subject to any disclaimer, the term of this patent is extended or adjusted under 35 U.S.C. 154(b) by 0 days.

(21) Appl. No.: 13/507,083

(22) Filed: Jun. 4, 2012

(65) Prior Publication Data

US 2013/0092896 A1    Apr. 18, 2013

Related U.S. Application Data

(60) Provisional application No. 61/457,808, filed on Jun. 8, 2011.

(51) Int. Cl.

| H01L 29/06 | (2006.01) |
| H01L 33/26 | (2010.01) |
| H01L 33/30 | (2010.01) |
| H01L 33/06 | (2010.01) |
| H01L 33/04 | (2010.01) |
| H01S 5/34 | (2006.01) |
| H01L 33/00 | (2010.01) |

(52) U.S. Cl.
CPC .............. *H01L 33/04* (2013.01); *H01L 33/26* (2013.01); *H01S 5/3407* (2013.01); *H01S 5/3403* (2013.01); *Y10S 977/773* (2013.01); *H01L 33/305* (2013.01); *H01L 33/06* (2013.01); *H01S 5/3422* (2013.01); *H01L 33/0062* (2013.01); *Y10S 977/762* (2013.01)

USPC  257/13; 257/14; 257/E29.072; 257/E31.033; 257/E33.008; 977/773; 977/762

(58) Field of Classification Search
USPC ............................................. 257/13
See application file for complete search history.

(56) References Cited

U.S. PATENT DOCUMENTS

| 6,597,717 | B1 * | 7/2003 | Kneissl et al. ............. 372/46.01 |
| 6,785,311 | B1 * | 8/2004 | Najda ........................ 372/45.01 |
| 6,822,266 | B2 * | 11/2004 | Kurahashi et al. ............... 257/86 |
| 6,836,496 | B1 * | 12/2004 | Kano et al. ................. 372/43.01 |
| 7,307,271 | B2 * | 12/2007 | Islam et al. ...................... 257/14 |
| 7,405,421 | B2 * | 7/2008 | Hashimoto et al. ............. 257/14 |
| 7,652,281 | B2 * | 1/2010 | Takahashi et al. ............... 257/13 |
| 7,781,755 | B2 * | 8/2010 | Sung et al. ....................... 257/13 |
| 7,951,633 | B2 * | 5/2011 | Yang .............................. 438/47 |
| 8,384,063 | B2 * | 2/2013 | Kondo et al. ................... 257/13 |
| 2002/0104996 | A1 * | 8/2002 | Kuo et al. ....................... 257/79 |
| 2003/0020079 | A1 * | 1/2003 | Hata et al. ...................... 257/85 |
| 2008/0283819 | A1 * | 11/2008 | Konno ........................... 257/13 |

* cited by examiner

*Primary Examiner* — Matthew W Such
*Assistant Examiner* — Samuel Lair

(57) ABSTRACT

A light-emitting device epitaxially-grown on a GaAs substrate which contains an active region composed of $Al_xGa_{1-x}$As alloy or of related superlattices of this materials system is disclosed. This active region either includes tensile-strained GaP-rich insertions aimed to increase the forbidden gap of the active region targeting the bright red, orange, yellow, or green spectral ranges, or is confined by regions with GaP-rich insertions aimed to increase the barrier height for electrons in the conduction band preventing the leakage of the nonequilibrium carriers outside of the light-generation region.

13 Claims, 11 Drawing Sheets

(a)

GaAs (b)

GaP (a)

(b)

OPTOELECTRONIC DEVICE WITH A WIDE BANDGAP AND METHOD OF MAKING SAME

REFERENCE TO RELATED APPLICATIONS

This application claims an invention which was disclosed in Provisional Application No. 61/457,808, filed Jun. 8, 2011, entitled "OPTOELECTRONIC DEVICE WITH A WIDE BANDGAP AND METHOD OF MAKING SAME". The benefit under 35 USC §119(e) of the United States provisional application is hereby claimed, and the aforementioned application is hereby incorporated herein by reference.

BACKGROUND OF THE INVENTION

1. Field of the Invention

The invention pertains to the field of optoelectronic devices. More particularly, the invention pertains to semiconductor light emitting devices for visible and infra-red spectral ranges.

2. Description of Related Art

There is a need in the light sources in the visible, particularly, in green-yellow and bright-red spectral ranges. Furthermore, there is a continuous need to improve temperature stability of the characteristics of the devices emitting in the near infrared spectral range. An improvement in the temperature stability of the characteristics of far-infrared light-emitters based on intrasubband transitions such as cascade lasers is also demanded. The limitations of the traditional heterostructure lasers and light emitting diodes are related to the fact that the spectral range and/or the temperature stability of the characteristics of the devices are defined by the maximum value of the forbidden gap, which can be realized for the direct bandgap materials, on the one hand, and by the availability of potential barriers preventing thermal escape of injected nonequilibrium carriers from the active region, on the other hand. Presently the problem has no universal solution, and each spectral range is covered by the preferred materials system. For example, bright red lasers and light-emitting diodes are produced using $In_yGa_{1-x-y}Al_xP$ materials and the related heterostructures deposited on GaAs substrates. Green and blue light emitting diodes (LEDs) are produced using $In_xGa_{1-x}N$ or $In_yGa_{1-x-y}Al_xN$ materials on sapphire, GaN, silicon or silicon carbide substrates. Infrared light emitters at wavelengths longer than 800 nm are typically produced using the $Al_xGa_{1-x}As$ materials system on GaAs substrates. $In_yGa_{1-x-y}Al_xAs$ or $In_xGa_{1-x}As_{1-y}P_y$ materials on InP substrates are preferred for light emitters at 1300 nm and longer wavelengths. Some extension of the wavelength range towards longer wavelength on a particular substrate can be additionally made by employing thin elastically strained insertions of narrow bandgap material in the form of layers, quantum wells (QWs), quantum wires (QWWs) or quantum dots (QDs). However, an opportunity to shift the emission spectrum towards the shorter wavelength using a similar approach was not demonstrated so far. For example, despite the fact that the direct bandgap of AlAs is ~3.5 eV corresponding to ~350 nm wavelength matching the ultraviolet range, it is not possible to realize efficient light sources in this material due to the indirect bandgap nature of this binary material. The use of $Al_xGa_{1-x}As$ wells or GaAs—AlAs superlattices having a direct bandgap structure to generate an emission spectrum is restricted to ~2 eV or 620 nm (bright red) or smaller energy and longer corresponding wavelength and even this wavelength cannot generally be reached at high efficiency due to the lack of confinement of nonequilibrium carriers in the light emitting device made of $Al_xGa_{1-x}As$ materials. In the conventional approach, for example, making monolithic white light emitters is generally not possible if only one materials system is used.

The solution to achieve white light emission in light-emitting diodes (LEDs) is presently based either on down conversion of the blue light using phosphorus or by heterogeneous integration of different light sources produced in different materials systems with the spectral mixing of the generated light. Lasers designed for different spectral ranges are typically produced using different materials. The temperature stability of the performance of the devices is typically sacrificed as the choice of the materials to achieve the necessary electron and hole confinement energies is limited.

Aluminum gallium arsenide ($Al_xGa_{1-x}As$) is presently broadly used in micro- and optoelectronics. In the whole range of aluminum compositions the lattice parameter of the material is closely lattice matched to the GaAs substrate and the strain is minimum even in the case of rather thick layers. Moderate concentrations of In, P, Sb or other atoms can be introduced in the material fractionally replacing by substitution some of the group III (Ga, Al) or the group V (As) atoms, respectively, to form strained insertions (quantum wells, quantum wires, or quantum dots). $In_xGa_{1-x}As$ insertions are typically introduced to adjust the wavelength of the gain material beyond the spectral range covered by GaAs and to reach wavelengths longer than ~870 nm, while $GaAs_{1-y}P_y$ layers, which have a larger bandgap as compared to GaAs are typically used in light-emitting devices for strain compensation of indium- or antimony-containing materials. The $In_yGa_{1-x-y}Al_xP$ materials system is suitable for bright-red LEDs and laser diodes. However, the lowest bandgap phosphide binary material in this system InP has a bandgap of 1.34 eV.

Furthermore, due to a significant ~3.8% lattice mismatch three-dimensional islands are usually formed after the deposition of only a few (2-3) monolayers of InP on the $In_xGa_{1-x}P$ surface, all on a GaAs substrate. Photoluminescence bands within the 750-680 nm spectral range are typically observed from these predominantly biaxially compressively strained QD insertions. These structures are hardly suitable for the majority of infrared devices emitting at wavelengths longer than 800 nm.

Thus, there exists a need to extend the spectral range of the $Al_xGa_{1-x}As$-based light emitting devices on GaAs substrates from infrared and deep red towards bright red, orange, yellow or green. On the other side, there is a need to increase the temperature stability of the characteristics of the AlGaAs-based devices operating in the conventional infrared spectral range.

SUMMARY OF THE INVENTION

A light-emitting device epitaxially-grown on a GaAs substrate which contains an active region composed of $Al_xGa_{1-x}As$ alloy or of related superlattices of this materials system is disclosed. This active region either includes tensile-strained GaP-rich insertions aimed to increase the forbidden gap of the active region targeting the bright red, orange, yellow, or green spectral ranges, or is confined by regions with GaP-rich insertions aimed to increase the barrier height for electrons in the conduction band preventing the leakage of the nonequilibrium carriers outside of the light-generation region.

BRIEF DESCRIPTION OF THE DRAWINGS

FIG. 6 depicts energy band offsets for the conduction and valence bands for unordered $In_{0.5}(Ga_{1-x}Al_x)_{0.5}P$ relative to $In_{0.5}Ga_{0.5}P$ as a function of Al mole fraction x.

DETAILED DESCRIPTION OF THE INVENTION

Figure 1:
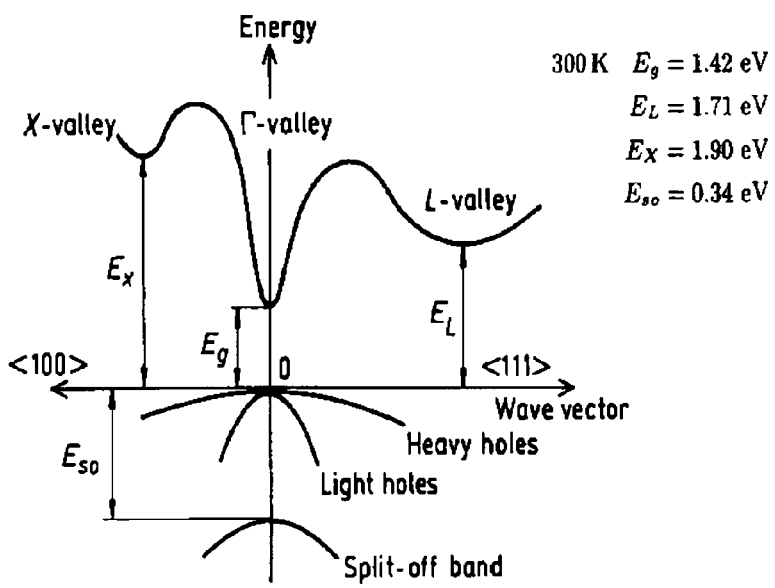
FIG. 1 shows a schematic representation of example band diagrams of materials used in prior art devices. (a) direct bandgap material: GaAs; (b) indirect bandgap material GaP.
Figure 1:
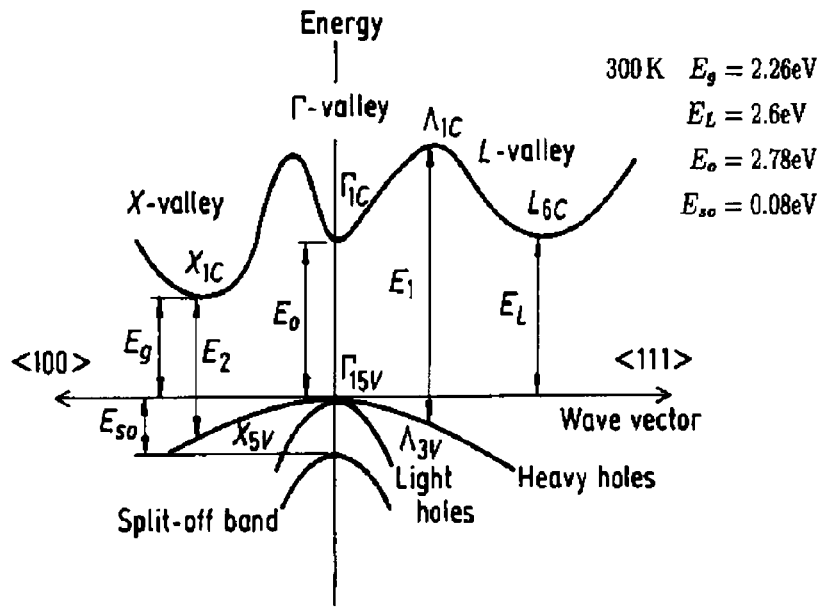

A schematic band diagrams of direct band gap (GaAs) and indirect band gap (GaP) III-V materials are shown in FIG. 1. The conduction band has three local minima: X, L, and $\Gamma$ at different coordinate in the wave vector space (k-space). The valence band is represented by three subbands all having their highest energies at zero k-values. The light hole, heavy hole, and split-off valence bands coexist. Strong inter-band photon absorption is possible accompanied by transitions from filled valence band states to empty states in the conduction band. As the k-vector of the photon is negligible, strong absorption is possible only for "vertical" transitions, for which no change in k-vector occurs. Thus, strong absorption is always related to the $\Gamma$ minimum of the conduction band. Once the nonequilibrium carriers are generated in the crystal, they thermalize with the crystal lattice emitting optical and acoustic phonons reaching the lowest energy states at the bottom of the conduction band and the top of the valence band for electrons and holes, respectively. In direct gap materials like GaAs these states are concentrated close to the zero wave vector point, electrons and holes with k-values close to zero coexist and may recombine radiatively by emitting photons. In indirect gap materials like GaP the lowest conduction band valley is positioned in the X valley at large wave vectors. Radiative recombination of electrons having large k-vectors and holes in the valence band with small k-vectors becomes prohibited. The probability of phonon-assisted recombination is low and the devices based on indirect gap materials cannot be used as light-emitting devices.

Figure 2:
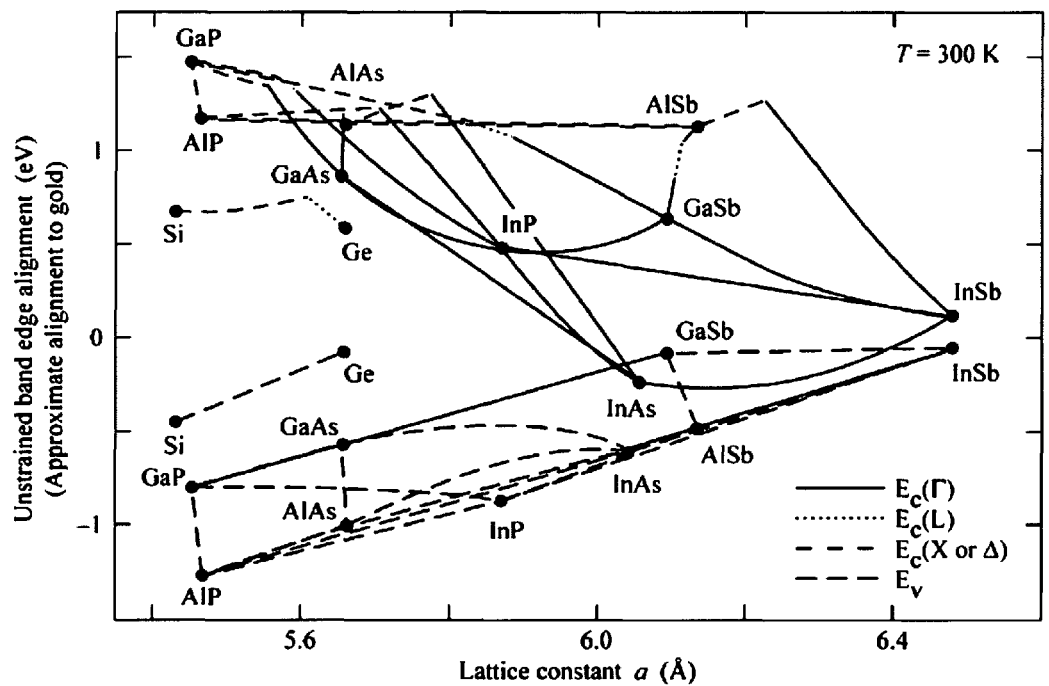
FIG. 2 shows band edges as a function of the lattice constant. The conduction band edge and valence band edge energies are plotted as a function of the lattice constant of the semiconductors. The circles indicate the band edges of the binary semiconductors and the lines show the band edges of the ternary alloys. The two endpoints of each ternary line are the binary constituents of that ternary. Discontinuities between two lattice matched or nearly matched semiconductor alloys may be found from the difference in energy between their band-edge energies. The zero energy point represents the approximate gold Schottky barrier position in the band gap of any given alloy (according to Sandip Tiwari and David J. Frank "Empirical fit to band discontinuities and barrier heights in III-V alloy systems" Applied Physics Letters, volume 60, issue 5, pp. 630-632, 3 Feb. 1992).

In FIG. 2 we show band edges as a function of the lattice constant in different III-V materials. The conduction band edge and valence band edge energies are plotted as a function of the lattice constant of the semiconductors. The circles indicate the band edges of the binary semiconductors and the lines show the band edges of the ternary alloys. The two endpoints of each ternary line are the binary constituents of that ternary. Discontinuities between two lattice-matched or nearly matched semiconductor alloys may be found from the difference in energy between their band-edge energies. The zero energy point represents the approximate gold Schottky barrier position in the band gap of any given alloy (according to Sandip Tiwari and David J. Frank "Empirical fit to band discontinuities and barrier heights in III-V alloy systems" Applied Physics Letters, volume 60, issue 5, pp. 630-632, 3 Feb. 1992).

From FIG. 2 one can conclude that on top of the bandgap structure, the alignment of the heterojuction band offset can affect the performance of optical devices. For example, in case of nonequilibrium carrier injection into thin GaAs layers confined by an AlAs region both electrons and holes will be confined in the same narrow gap GaAs region and may recombine radiatively. As opposite, in another extreme case of two direct gap semiconductors GaSb and InAs the top of the valence band of the narrower gap InAs material is positioned higher than the top of the valence band in GaSb. Thus in thin InAs layers surrounded by GaSb only the nonequilibrium electrons can be confined in the narrow gap material, while the holes remain in the wider gap material. A similar situation occurs for the combination of InAs and the indirect band gap AlSb material. Lateral separation of electrons and holes deteriorates the probability of radiative recombination, which becomes limited by the thin interface region where wavefunctions of nonequilibrium carriers may overlap. Indirect bandgap GaP—AlP semiconductors also form this type of a staggered line-up heterojunction. Thus, on top of the direct bandgap structure of the wide bandgap material applicable for light-emitting devices it is also of utmost importance to realize efficient confinement of nonequilibrium electrons and holes in the same region preventing their escape into the surrounding passive regions, for example, narrow gap contact regions, doped buffer layers, or the substrate, where the nonequilibrium carriers may recombine either nonradiatively or by emission of photons with a smaller photon energy. As it follows from FIG. 2, GaP provides the highest potential barrier in the conduction band allowing the ultimate confinement of electrons in wide bandgap III-V zinc-blend crystal-structure materials.

Figure 3:
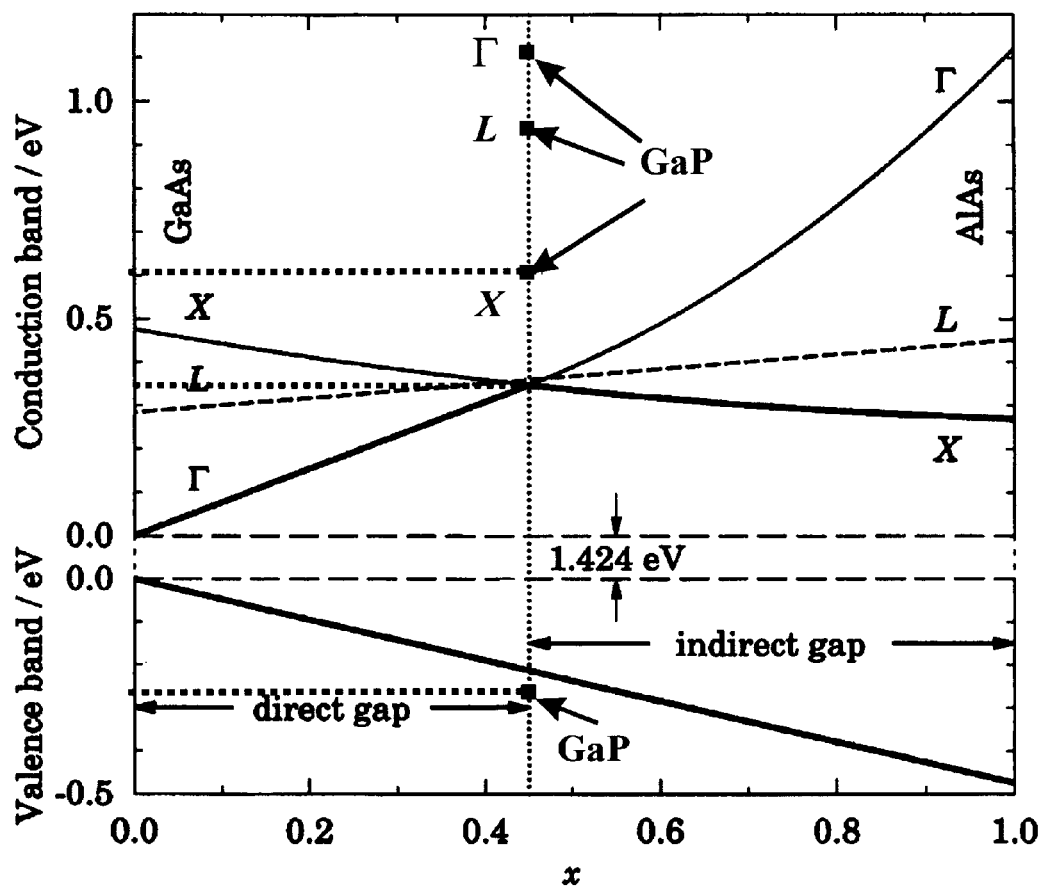
FIG. 3 shows the conduction band energies at the three points of high symmetry, namely at the points $\Gamma$, X and L of the Brillouin zone and the energy of the top of the valence band (at the $\Gamma$ point) in $Al_xGa_{1-x}As$ as a function of the composition x. Conduction band energies at points $\Gamma$, X and L of the Brillouin zone and the energy of the top of the valence band (at the $\Gamma$ point) in unstrained GaP are superimposed at an $Al_xGa_{1-x}As$ composition corresponding to the maximum bandgap energy of the direct gap alloy material (x=0.45).

In FIG. 3 we show energies of the three points of high symmetry in the Brilloiun zone, namely $\Gamma$, X, and L points, and the top of the valence band in $Al_xGa_{1-x}As$ as a function of the composition x. The minimum energy in the conduction band is determined by the minimum energy value in these three points. Conduction band energies at $\Gamma$, X, and L points and the energy of the top of the valence band in unstrained GaP are superimposed at an AlAs composition corresponding to the maximum bandgap energy of the direct gap alloy material, i.e. at x=0.45. The energy shift of the potential barrier in the conduction band is up to 240 meV. This indicates a potential possibility to confine nonequilibrium carriers and create artificial superlattices in the $Ga_{1-x}Al_xAs_{1-y}P_y$ system with the direct bandgap up to about ~2.2 eV (564 nm) matching the green spectral range with significant confinement of nonequilibrium carriers.

Figure 4:
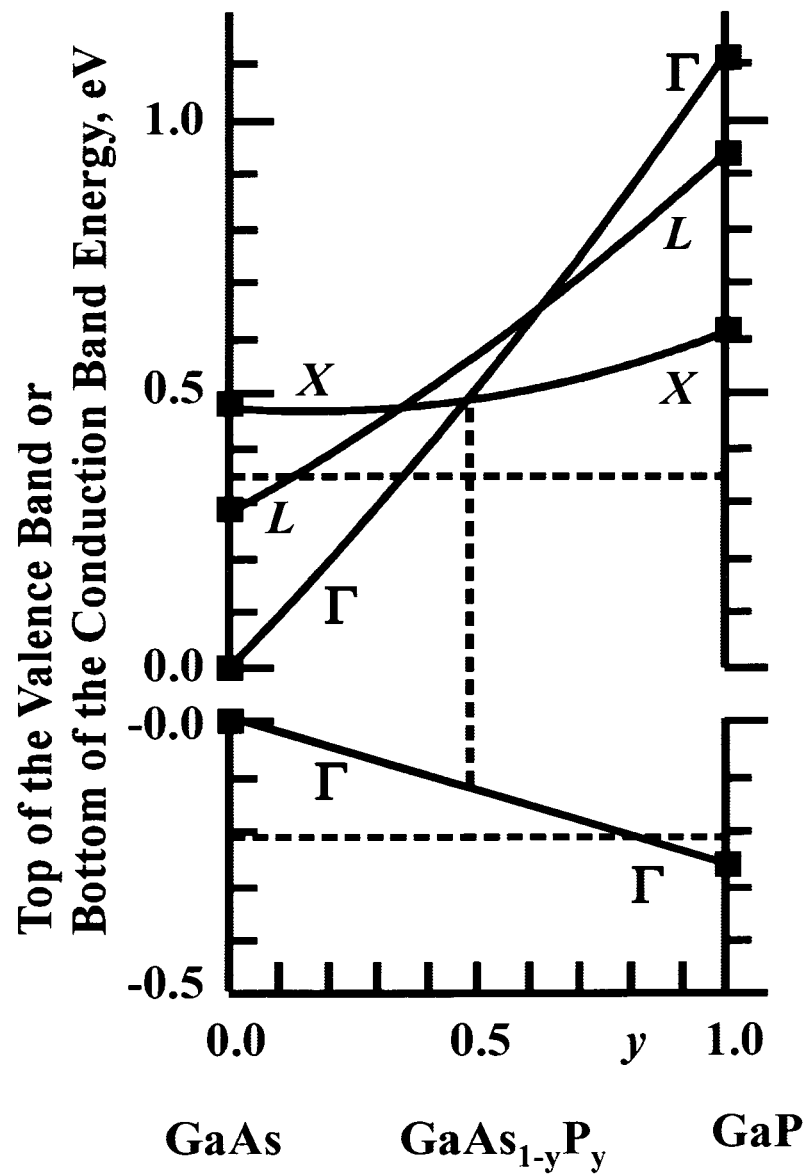
FIG. 4 shows a schematic representation of the conduction band energies at the points $\Gamma$, X and L of the Brillouin zone and the top of the valence band (at the $\Gamma$ point) for unstrained $GaAs_{1-x}P_x$. Horizontal dashed lines show the top of the valence band and the bottom of the conduction band in $Al_xGa_{1-x}As$ for the aluminum composition matching the direct-to-indirect gap transition (x=0.45).

In FIG. 4 we provide an example of a wide bandgap medium. A schematic representation of the $\Gamma$, X, and L points in the conduction band and the top of the valence band at the $\Gamma$ point for unstrained $GaAs_{1-y}P_y$ are shown. Horizontal dashed lines show the top of the valence band and the bottom of the conduction band in $Al_xGa_{1-x}As$ for the aluminum composition matching the direct-to-indirect gap transition (x=0.45). The bandgap of the direct gap $GaAs_{1-y}P_y$ is larger than the maximum bandgap of the direct gap $Al_xGa_{1-x}As$ material and reaches 2.03 eV which corresponds to the wavelength of ~610 nm enabling the realization of the light-emitting devices in the orange spectral range.

Figure 5:
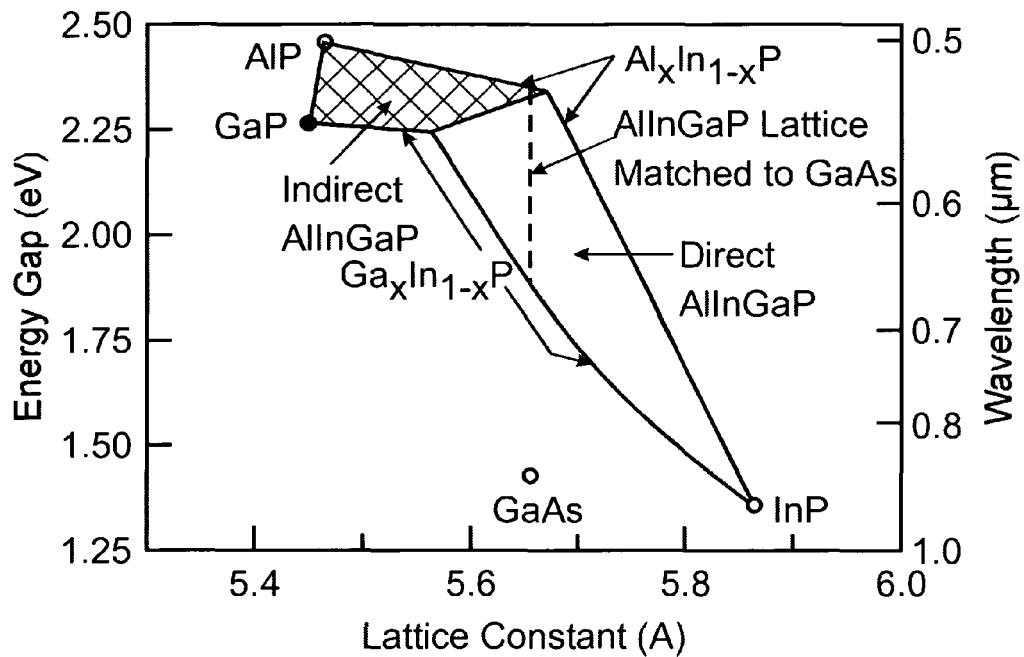
FIG. 5 shows the bandgap energy of the $In_yGa_{1-x-y}Al_xP$ alloy and its corresponding wavelength versus lattice constant.

FIG. 5 shows the bandgap energy of the $In_yGa_{1-x-y}Al_xP$ alloy and its corresponding wavelength versus lattice constant. The maximum direct energy bandgap reachable by these alloys is 2.314 eV corresponding to the wavelength of light 536 nm in the green spectral range. The figure is taken from D. A. Vanderwater, I.-H. Tan, G. E. Hofler, D. C. Defevere, and F. A. Kish, "High-Brightness AlGaInP Light Emitting Diodes", Proceedings of the IEEE, volume 85, issue 11, pp. 1752-1764, November 1997.

Figure 6:
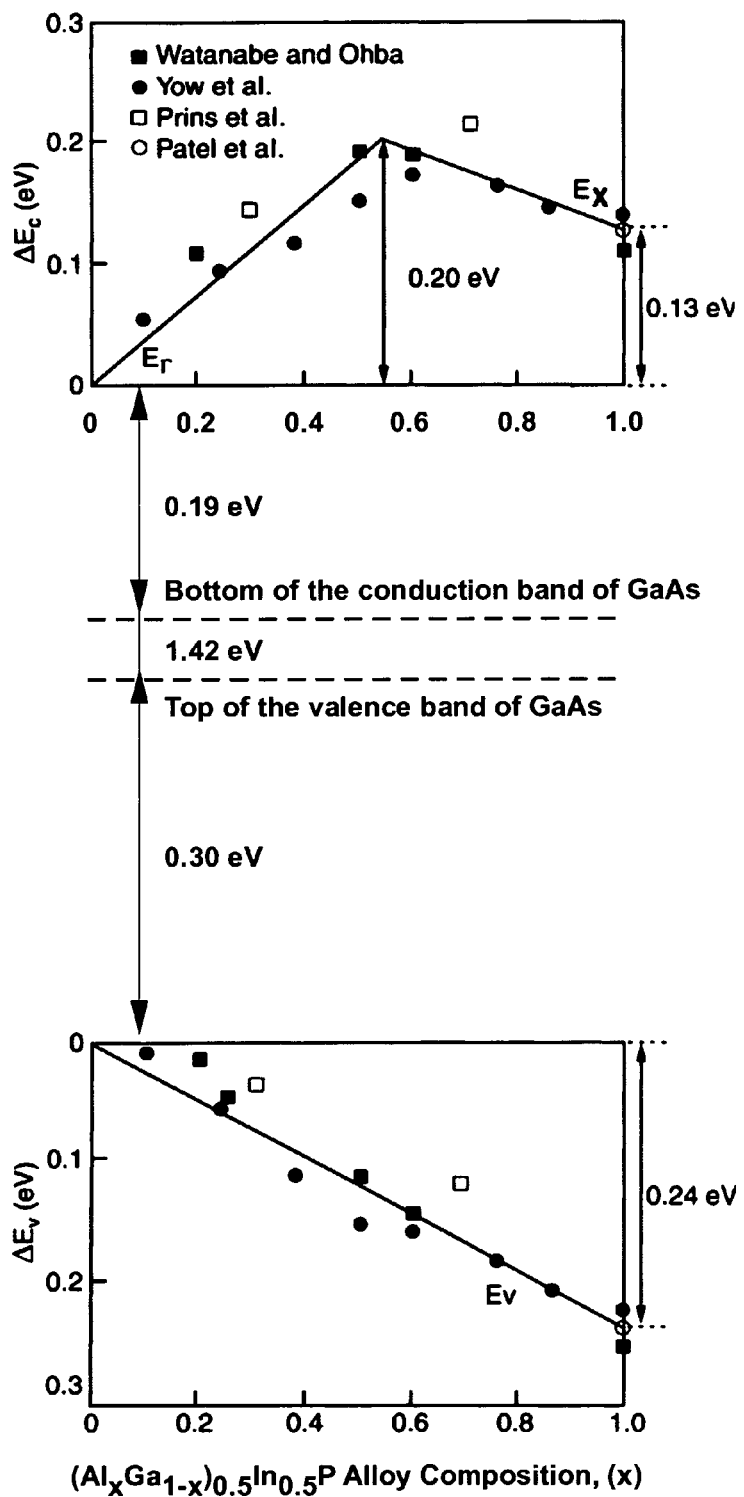
FIG. 6 shows the lowest energy point of the conduction band (X) and the split energy level at the $\Gamma$ point of the valence bands for tensile strained GaP. The surface of the biaxially-strained GaP layer is oriented towards the <100> direction causing a lifting of the degeneracy and a significant energy split between the two nonequivalent types of the X valleys. The vertical dotted line corresponds to the tensile strain originating in the epitaxial GaP film deposited on a GaAs substrate.

FIG. 6 depicts energy band offsets for the conduction and valence bands for unordered $In_{0.5}(Ga_{1-x}Al_x)_{0.5}P$ relative to $In_{0.5}Ga_{0.5}P$ as a function of Al mole fraction x. The maximum conduction band offset ($\Delta E_c$) is approximately 0.2 eV and occurs in the range of x~0.5 to 0.7. The maximum valence band offset ($\Delta E_v$) occurs for $In_{0.5}Al_{0.5}P$ and is approximately 0.24 eV. Experimental data are taken from the following sources: Miyoko O. Watanabe and Yasuo Ohba, "Interface properties for GaAs/InGaAlP heterojunctions by the capacitance-voltage profile technique", Applied Physics Letters, volume 50, issue 14, pp. 906-908, 6 April 1987: H. K. Yow, P. A. Houston, and M. Hopkinson, "Conduction band discontinuities in $Ga_{0.5}In_{0.5}P$—$Al_xGa_{0.5-x}In_{0.5}P$ heterojunctions measured by internal photoemission", Applied Physics Letters, volume 66, issue 21, pp. 2852-2854, 22 May 1995; A. D. Prins, J. L. Sly, A. T. Meney, D. J. Dunstan, E. P. O'Reilly, A. R. Adams, and A. Valster, "Direct measurements of band offsets in GaInP/AlGaInP using high pressure", Journal of Physics and Chemistry of Solids, volume 54, issue 3-4, pp. 93-97, 1995; D. Patel, M. J. Hafich, G. Y. Robinson, and C. S. Menoni, "Direct determination of the band discontinuities in $In_xGa_{1-x}P/In_yGa_{1-y}P$ multiple quantum wells", Physical Review B, volume 48, issue 24, pp. 18031-18036, 15 Dec. 1993. It should be noted that the maximum barrier in the conduction band of $In_{0.5}(Ga_{1-x}Al_x)_{0.5}P$ is about 0.39 eV above the bottom of the conduction band of GaAs, which only slightly exceeds the maximum barrier height in the $Ga_{1-x}Al_xAs$ materials system, the latter equal 0.35 eV (FIG. 3).

Therefore, the X point of GaP insertions has the energy level (shown in FIG. 3) which is 0.22 eV higher than the highest possible energy level of the alloy $In_{0.5}(Ga_{1-x}Al_x)_{0.5}P$. This means that thin GaP insertions can serve as sufficiently high barriers for electrons in devices, in which quaternary alloys $In_{0.5}(Ga_{1-x}Al_x)_{0.5}P$ are used as an active medium.

Figure 7:
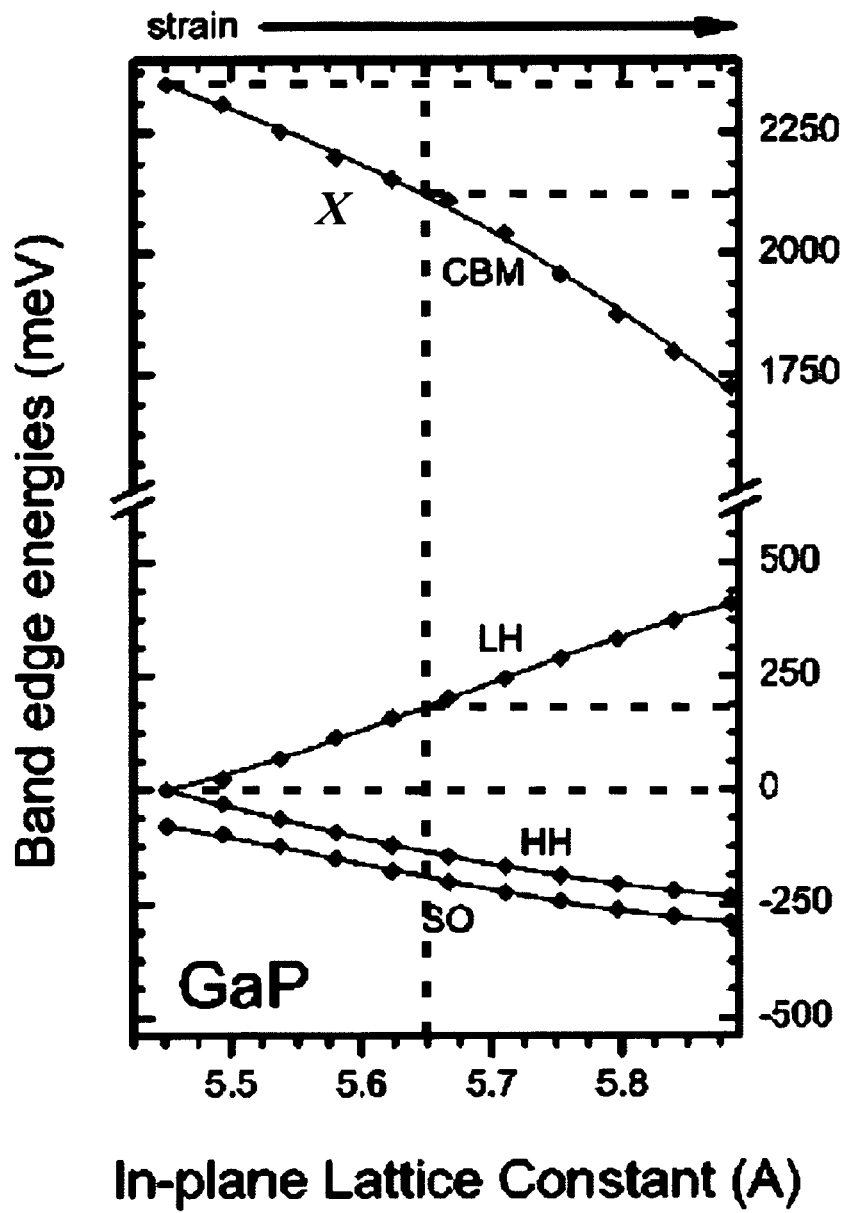
FIG. 7 shows the lowest energy point of the conduction band (X) and the split energy level at the $\Gamma$ point of the valence bands for tensile strained GaP. The surface of the biaxially-strained GaP layer is oriented towards the <100> direction causing a lifting of the degeneracy and a significant energy split between the two nonequivalent types of the X valleys. The vertical dotted line corresponds to the tensile strain originating in the epitaxial GaP film deposited on a GaAs substrate.

One should mention that there is a significant lattice mismatch of ~3.6% between GaP insertions and a GaAs substrate. In FIG. 7 we show the bottom point of the conduction band (X) and the tops of the valence bands for tensile strained GaP. The surface of the biaxially-strained GaP layer is oriented towards <100> direction causing a lifting of the degeneracy and a significant energy split between the X valleys in the non-equivalent points of the Brillouin zone. The vertical dotted line corresponds to the tensile strain originating in the epitaxial GaP film deposited on a GaAs substrate.

One can notice that the strain-induced shift of the conduction band is significant and does not prevent efficient barrier formation with $Ga_{0.55}Al_{0.45}As$ in the conduction band for high content of GaP. There is a significant shift of the light hole subband. However as the effective mass of the light hole is small and the GaP or $GaAs_{1-y}P_y$ layer can be thin, size quantization effects prevent formation of strongly localized states for the light holes. Furthermore, there exists a significant shift of the heavy hole and split-off subbands. Thus, adding ultrathin AlAs layers can increase the forbidden gap due to the barrier formation for heavy holes.

Figure 8:
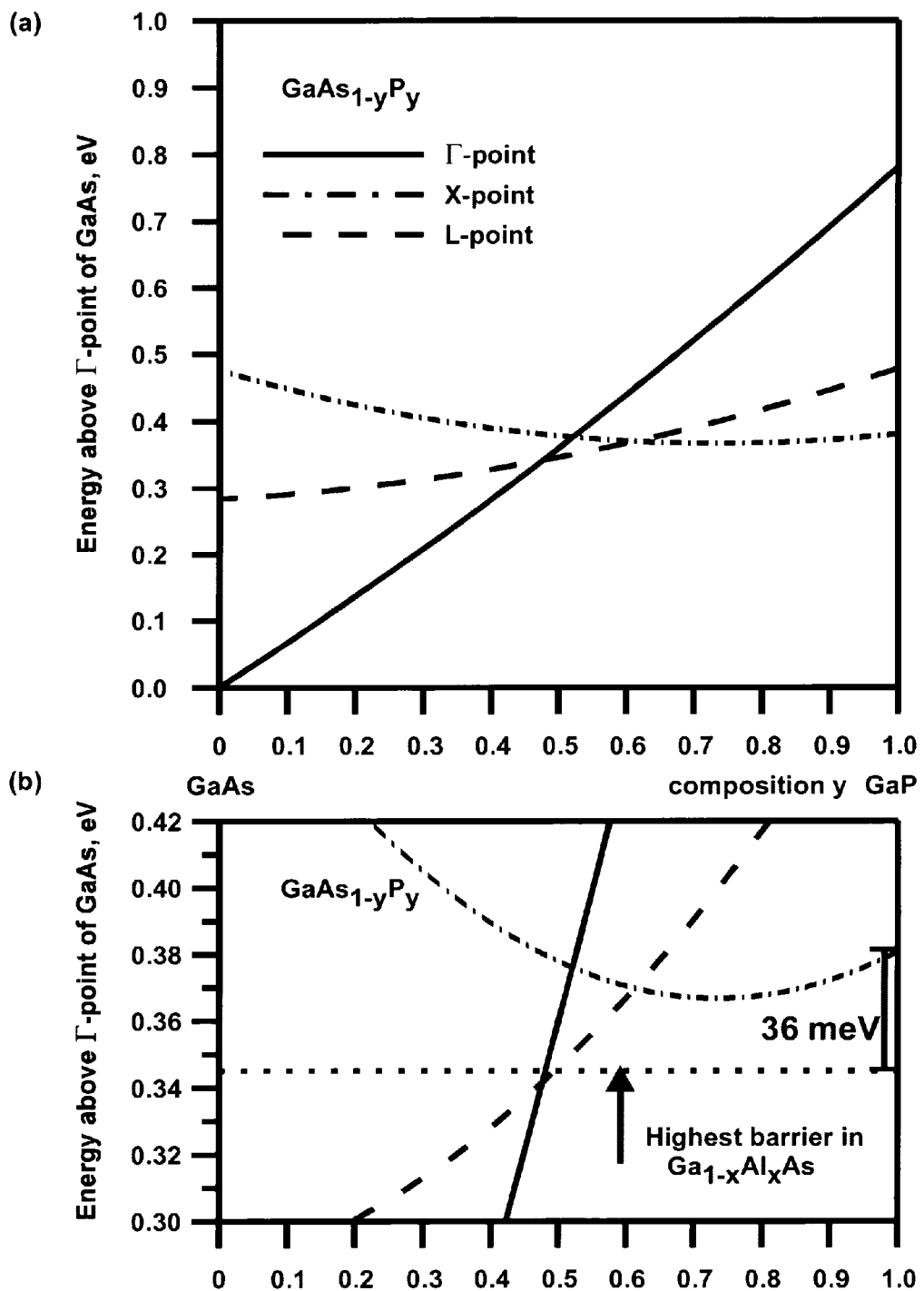
FIG. 8 shows the calculated conduction band energies at the points $\Gamma$, X and L of the strained $GaAs_{1-y}P_y$ on a GaAs (100) substrate as a function of phosphorous composition y including the X-valley splitting effect. (a) Figure shows the entire range of energies. (b) Figure shows, with a larger magnification, the range of energies close to the crossing points.

In FIG. 8 the calculated energies at the $\Gamma$, X and L points of the strained $GaAs_{1-y}P_y$ on a GaAs (100) substrate are shown as a function of phosphorous composition Y including the X-valley splitting effect. To carry out the calculations, we used the quadratic approximation for the energy levels in the unstrained ternary alloy $AB_xC_{1-x}$, following M. P. C. M. Krjin, ("Heterojunction band offsets and effective masses in III-V quaternary alloys", Semiconductor Science and Technology, volume 6, pages 27-31, 1991)):

$$E_{ABC}(x)=xE_{AB}+(1-x)E_{AC}-x(1-x)C_{ABC}. \quad (1)$$

Here E is the energy level in one of the points Γ, X, or L in the conduction band, subscripts AB and AC refer to binary compounds, and C is the bowing parameter.

The pseudomorphic alloy $GaAs_{1-y}P_y$ containing phosphorus is under biaxial tensile strain along the [001] direction. The strain further shifts the energy levels with respect to those in an unstrained material. The strain tensor in the pseudomorphic layer equals $$\varepsilon_{ij} = \begin{bmatrix} \varepsilon_{xx} & 0 & 0 \\ 0 & \varepsilon_{xx} & 0 \\ 0 & 0 & \varepsilon_{zz} \end{bmatrix}. \quad (2)$$

Here $$\varepsilon_{xx} = \frac{\Delta a}{a}, \quad (3a)$$

is the in-plane lattice mismatch, and the remaining strain component equals $$\varepsilon_{zz} = -2\frac{c_{12}}{c_{11}} \times \frac{\Delta a}{a}, \quad (3b)$$

where $c_{11}$ and $c_{12}$ are the elastic moduli in the Voigt notation.

The deformation shift of the Γ point is proportional to the hydrostatic strain, $$\Delta E_c^\Gamma = a_c^\Gamma (2\varepsilon_{xx} + \varepsilon_{zz}), \quad (4)$$

where $a_c^\Gamma$ is the hydrostatic deformation potential for the Γ point.

The energy level at the X point splits due to strain. The shifts of the individual valleys of the split X point equal (C. G. Van de Walle, "Band lineups and deformation potentials in the model solid theory", Physical Review B, volume 39, number 3, pp. 1871-1883, 15 Jan. 1989-II)

$$\Delta E_c^{X \cdot [100]} = \Delta E_c^{X \cdot [010]} = E_1(2\varepsilon_{xx} + \varepsilon_{zz}) - \frac{1}{3}\Theta_u^\Delta(\varepsilon_{zz} - \varepsilon_{xx}), \quad (5a)$$

$$\Delta E_c^{X \cdot [001]} = E_1(2\varepsilon_{xx} + \varepsilon_{zz}) + \frac{2}{3}\Theta_u^\Delta(\varepsilon_{zz} - \varepsilon_{xx}). \quad (5b)$$

The energy level at the L point in the biaxally strained layer remains unsplit and shifts proportional to the hydrostatic strain, $$\Delta E_c^L = E_2(2\varepsilon_{xx} + \varepsilon_{zz}). \quad (6)$$

To carry out model calculations of the height and optimum compositions of the phosphorus-containing barriers, we use the "most agreed" parameters from the literature for the band offsets, bowing parameters, and deformation potentials.

The energy of the valence band maximum with respect to the vacuum value as well as the energy band gaps in Γ, X, and L points for binary compounds are taken from the above cited paper by Tiwari et al., Table II of the paper. The bowing parameters of the energies of the Γ, X, and L points are taken for ternary compounds from Table III of the same Tiwari's paper.

Hydrostatic deformation potentials for the conduction band for the binary compounds for Γ point are taken from Vurgaftman et al., (I. Vurgaftman, J. R. Meyer, and L. R. Ram-Mohan, "Band parameters for III-V compound semiconductors and their alloys", Journal of Applied Physics, volume 89, issue 11, pp. 5815-5875, 1 Jun. 2001). Zero bowing parameters of these deformation potentials are assumed for ternary alloys.

Hydrostatic deformation potentials for the conduction band for the binary compounds for the L point are taken from Cardona et al., (M. Cardona and N. E. Christensen, "Acoustic deformation potentials and heterojunction band offsets in semiconductors", Physical Review B, volume 35, number 12, pp. 6182-6194, 15 Apr. 1987-10. Zero bowing parameters for these deformation potentials are assumed for ternary alloys.

The strain-induced shift of the lower split X point is available from the first principles calculations for GaP (P. R. C. Kent, Gus L.-W. Hart, and Alex Zunger, "Biaxial strain-modified valence and conduction band offsets of zinc-blend GaN, GaP, GaAs, InN, InP, and InAs, and optical bowing of strained epitaxial InGaN alloys", Applied Physics Letters, volume 81, issue 23, pages 4377-4379, 2 Dec. 2002). We assume the same value of the deformation potentials for other binary alloys. Also the zero bowing parameter is assumed for these deformation potential.

Results of the calculations shown in FIG. 8 depict the maximum barrier height in the conduction band is 36 meV which is about the Boltzmann energy at room temperature.

Figure 9:
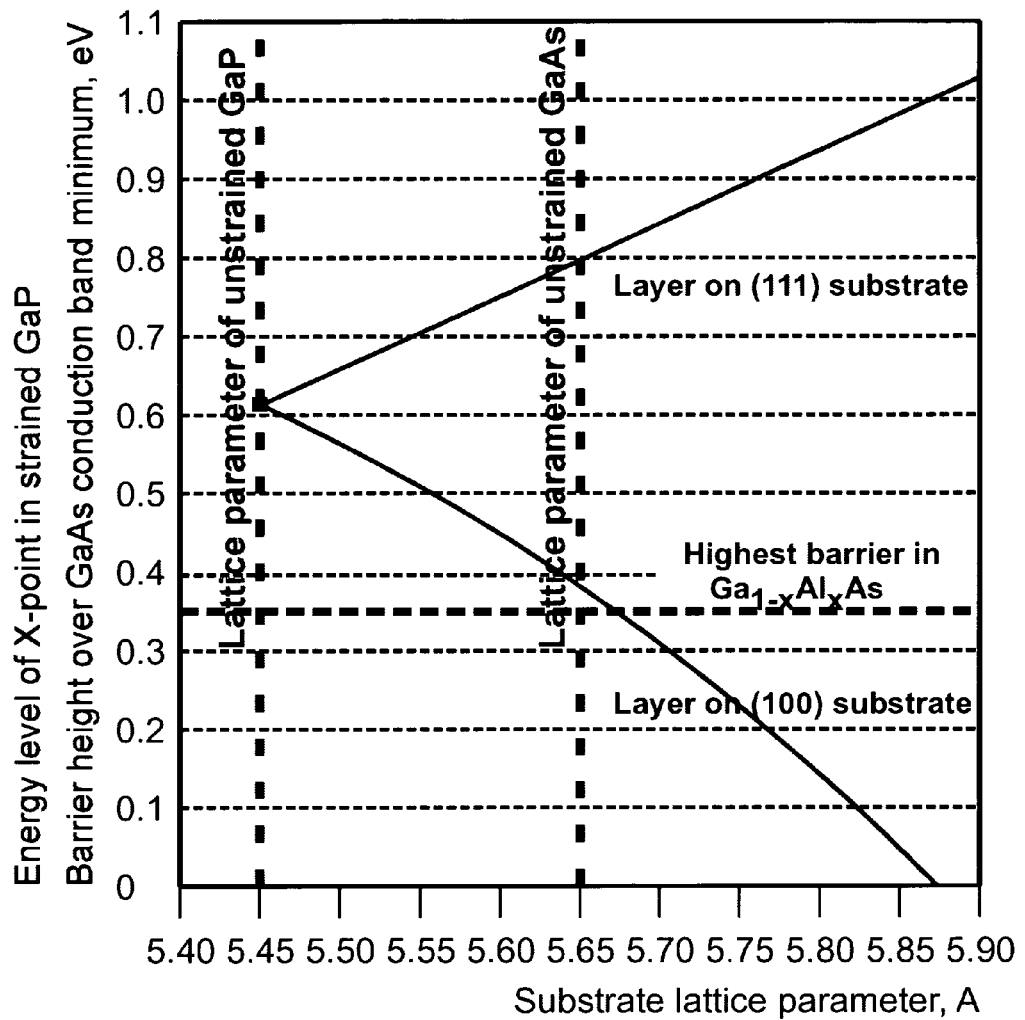
FIG. 9 shows the calculated band gap energies and the conduction band energies at the X point of the Brillouin zone of the tensile strained GaP on substrates having a different bulk lattice mismatch with GaP. The bandgap narrowing is the strongest for the (100) substrate, while the bandgap increases at the X point upon tensile strain in the case of the (111)-oriented substrate where the X valleys remain degenerate.

In FIG. 9 the calculated energy bottoms of the X conduction band of the tensile strained GaP on GaAs substrates having a different bulk lattice mismatch with GaP are shown for two different orientations of the substrate. The bandgap narrowing is the strongest for the (100) substrate due to the splitting of the X valleys. On the contrary, in the case of (111) or (−1, −1, −1) oriented substrate, biaxial strain does not lead to the splitting of the X valleys. Only hydrostatic strain contributes to the shift, equal for all the X valleys;

$$\Delta E_c^{x \cdot [100]} = \Delta E_c^{x \cdot [010]} = \Delta E_c^{x \cdot [001]} = E_1(2\varepsilon_{xx} + \varepsilon_{zz}). \quad (7)$$

The values of hydrostatic deformation potential of the X valleys are given in the paper by Van de Walle. A remarkable feature of the X valleys is that the hydrostatic deformation potential is positive, which implies that tensile strain increases the height of the barrier, as is shown in FIG. 9.

Figure 10:
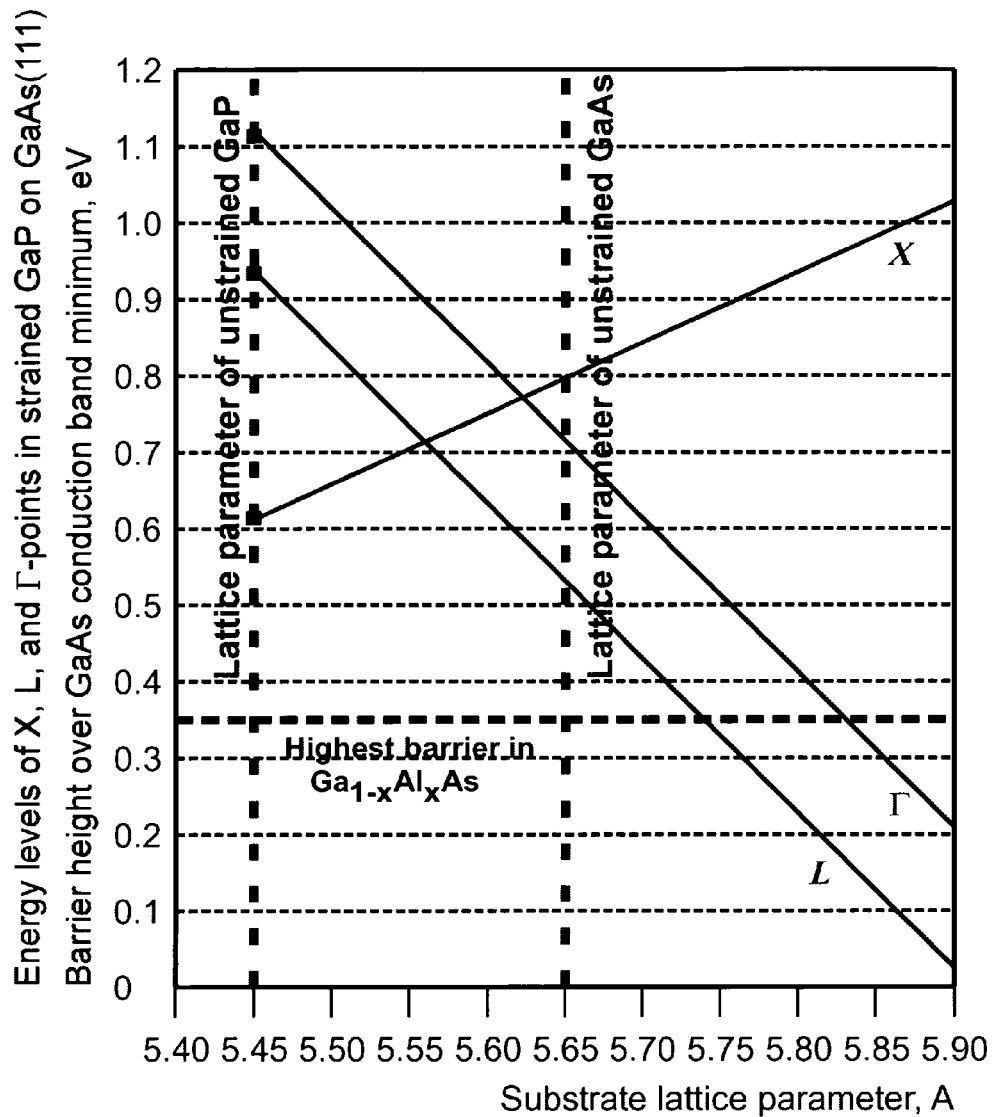
FIG. 10 shows the calculated conduction band energies at the points $\Gamma$, X and L of the tensile strained GaP having a different bulk lattice mismatch with GaP.

FIG. 10 depicts the variation of the energy levels of a strained GaP layer on a (111) substrate. Figure shows three high symmetry points in the conduction band, namely the unsplit energy level at X point, the unsplit energy level at Γ-point, and lowest energy level of the split Γ-point versus substrate lattice parameter. At certain strain (about 2%) the sequence of the energy levels changes, and L point becomes the lowest energy point. Nevertheless, tensile strained GaP layer on a GaAs substrate, has the energy at the L point of the conduction band which has a higher energy than the highest energy barrier in $Ga_{1-x}Al_xAs$ materials system. Furthermore, the energy is about 0.52 eV above the bottom of the conduction band of GaAs, which is higher than the highest energy of the bottom of conduction band in $In_{0.5}(Ga_{1-x}Al_x)_{0.5}P$ shown in FIG. 6, the latter barrier having the height of 0.39 eV defined with respect to the bottom of the conduction band of GaAs.

A one skilled in the art will appreciate that there exists a number of alloy materials $GaAs_{1-y}P_y$ and $Ga_{1-x}Al_xAs_{1-y}P_y$ having a composition close to GaP which will provide a barrier in the conduction band higher than those of $Ga_{1-x}Al_xAs$ and $In_{0.5}(Ga_{1-x}Al_x)_{0.5}P$.

Barriers higher than those in $GaAs_{1-y}P_y$ and $Ga_{1-x}Al_xAs_{1-y}P_y$ can be also formed in the strained layers on GaAs substrates with the spatial orientation different from <111>.

Another approach is to apply effects related to spontaneous nanofaceting or step bunching for the epitaxial growth of GaP layers or GaP-containing alloys to mix the tensile strain between different directions thus reducing the splitting of the X valley as compared to the splitting in a planar strained layer on a (100) substrate. Strain-induced formation of corrugations of the GaP insertion along the <110> direction in the GaP layer have been observed (L.-E. Wernersson, M. Borgstroem, B. Gustafson, A. Gustafsson, I. Pietzonka, M. E. Pistol, T. Sass, W. Seifert, and L. Samuelson, "Metalorganic vapor phase epitaxy-grown GaP/GaAs/GaP and GaAsP/GaAs/GaAsP n-type resonant tunneling diodes", Applied Physics Letters, volume 80, issue 10, pp. 1841-1843, 11 Mar. 2002).

A further approach includes growing strained insertion in such a mode that the material of the insertion forms three-dimensional islands. Then the strain profile will be inhomogeneous, and the splitting of the X valley of the insertion will be reduced compared to the splitting in a planar strained layer on a (100) substrate).

Figure 11:
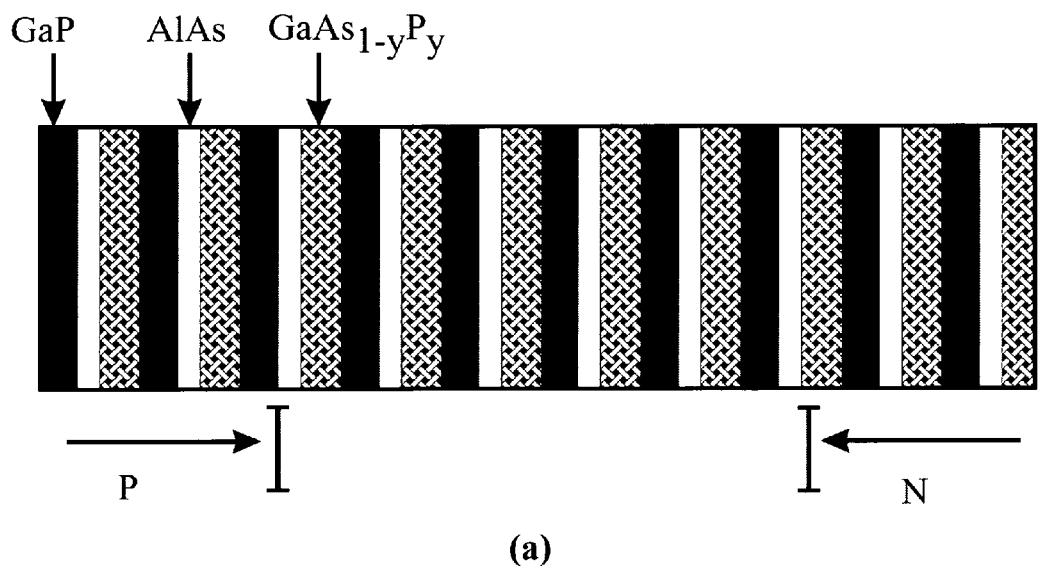
FIG. 11(a) shows a schematic representation of the example active medium used in the device and composed of thin layers of GaP, AlAs and $GaAs_{1-y}P_y$. A $GaAs_{1-y}P_y$ layer thickness and composition are selected to result in the direct bandgap alignment. GaP layers ensure the highest possible potential barriers to prevent leakage of electrons through X and L conduction band minima. AlAs layers provide the highest potential barriers for light-hole states preventing the bandgap shrinkage. The medium may be designed for light emission in the bright-red or yellow-green spectral ranges.
FIG. 11(b) shows an $Al_{0.45}Ga_{0.55}As$ region with $Al_{0.45(1-y)}Ga_{0.55+0.45y}As_{1-y}P_y$ insertions aimed at the creation of potential barriers preventing leakage of nonequilibrium electrons from the narrower gap regions confined by such heterostructures.
Figure 11:
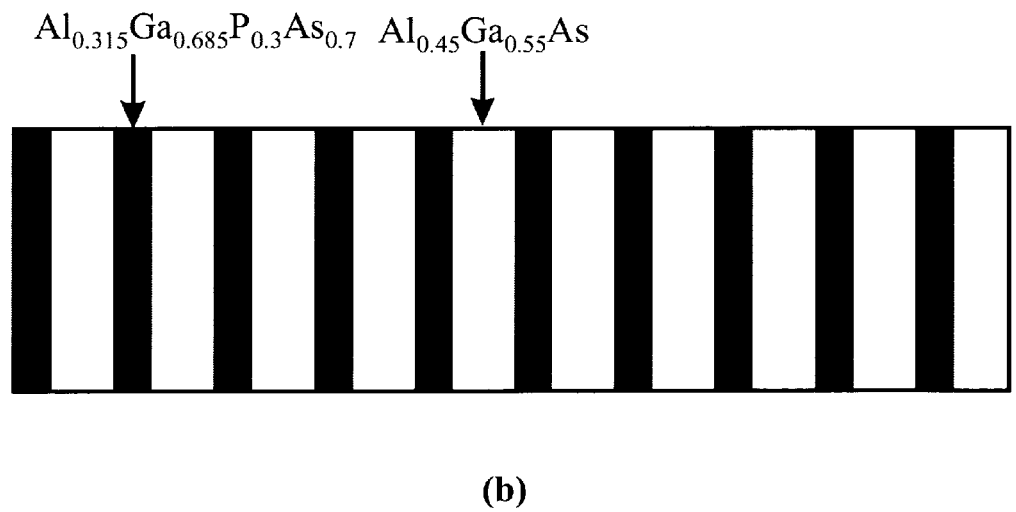

In FIG. 11(a) we show an example active medium used in the device and composed of thin layers of GaP, AlAs, and $GaAs_{1-x}P_x$. A $GaAs_{1-x}P_x$ layer thickness and composition are selected to result in a direct bandgap alignment. GaP layers ensure the highest possible potential barriers to prevent leakage of electrons through X and L conduction band minima. AlAs layers provide the highest potential barriers for light-hole states preventing the bandgap shrinkage. The AlAs layer is thin enough to ensure efficient size quantization of X and L electrons. The medium may be designed for light emission in the bright-red, or yellow-green spectral ranges. In FIG. 11(b) we show an $Al_{0.45}Ga_{0.55}As$ region with $Al_{0.45(1-y)}Ga_{0.55+0.45y}As_{1-y}P_y$ insertions aimed at the creation of potential barriers preventing leakage of nonequilibrium electrons from the narrower gap regions confined by such heterostructures.

The invention can be applied to all types of light-emitting diodes and injection lasers based on the $Al_xGa_{1-x}As$ materials system. Additional chemical elements may be introduced. For example, indium and antimony can be used for strain compensation or adjustments of the band edges in each particular case. Also for example strain-compensating $In_yGa_{1-x-y}Al_xAs$ indirect bandgap layers can be used as passive elements of the light-emitting structure. In case GaP-rich layers prevent significant leakage of nonequilibrium carriers from the light-generating region towards the passive layers the improved functionality remains.

The invention addresses devices based on valence to conduction band transitions and also intra subband or intralevel transitions in layers, quantum wells, and quantum dots. For example, it can be applied in cascade lasers to prevent electron tunneling out of the population inversion region.

A one skilled in the art will appreciate that various III-V semiconductor materials can be used to form the layers of an optoelectronic device of the present invention. The materials include, but are not limited to: binary semiconductors, alloys of semiconductor materials, atomically ordered structures of semiconductor materials, and any combinations thereof.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The present invention should not be understood as limited to the specific embodiments set out above but to include all possible embodiments which are embodied within a scope encompassed and equivalents thereof with respect to the features set out in the appended claims. Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A semiconductor optoelectronic device comprising
   (i) an active region capable of generating light through radiative recombination of nonequilibrium carriers;
   (ii) a means for the injection of nonequilibrium carriers into said active region;
   wherein said semiconductor optoelectronic device is epitaxially grown on a substrate;
   wherein at least one layer of said semiconductor optoelectronic device is formed of a III-V semiconductor material;
   wherein said active region further comprises at least one insertion;
   wherein said at least one insertion contains phosphorus atoms in the anion sublattice and gallium atoms in the cation sublattice;
   wherein said at least one insertion is tensile strained with respect to said substrate;
   wherein said
      insertion creates a barrier for nonequilibrium electrons,
         wherein the barrier for nonequilibrium electrons prevents their leakage away from said active region, and
         wherein the barrier is a current blocking layer for electrons, and
         wherein the barrier for nonequilibrium electrons exceeds the maximum barrier height possible in the gallium-aluminum arsenide materials system.

2. The semiconductor optoelectronic device of claim 1, wherein said barrier for nonequilibrium electrons exceeds zero point four electron Volts (0.4 eV) defined with respect to the bottom of the conduction band of gallium arsenide.

3. The semiconductor optoelectronic device of claim 1, wherein said III-V semiconductor material is selected from a group consisting of:
   (a) binary III-V semiconductor material;
   (b) alloy of III-V semiconductor materials;
   (c) atomically ordered structure of III-V semiconductor materials; and
   (d) any combination of (a) through (c).

4. The semiconductor optoelectronic device of claim 1, wherein the device is chosen from a group of devices consisting of:
   (a) light emitting diodes;
   (b) diode lasers;
   (c) cascade lasers; and
   (d) optical amplifiers.

5. The semiconductor optoelectronic device of claim 1, wherein the active region is chosen from the group of active regions consisting of:
(a) bulk material;
(b) quantum well material;
(c) superlattice material;
(d) quantum wire material;
(e) quantum dot material;
(f) any combination of (a) through (e).

6. The semiconductor optoelectronic device of claim 1 wherein the fraction of phosphorus atoms in the anion sublattice of said insertion exceeds twenty per cent.

7. The semiconductor optoelectronic device of claim 6 wherein the fraction of phosphorus atoms in the anion sublattice of said insertion exceeds fifty per cent.

8. The semiconductor optoelectronic device of claim 7 wherein the anion sublattice of said insertion consists completely of phosphorus atoms.

9. The semiconductor optoelectronic device of claim 8 wherein said insertion is formed of gallium phosphide.

10. The semiconductor optoelectronic device of claim 1 wherein insertions containing gallium phosphide are formed under conditions selected from the group of formation conditions consisting of:
(i) the insertions are formed via epitaxial growth on a substrate oriented along the one-one-one (<111>) crystallographic direction; or
(ii) the insertions are formed via epitaxial growth on a substrate oriented along the "minus one"-"minus one"-"minus one" ($<\bar{1}\bar{1}\bar{1}>$) crystallographic direction; or
(iii) the insertions are formed via epitaxial growth on a substrate misoriented from the zero-one-one crystallographic direction towards the one-one-one (<111>) crystallographic direction by less than two degrees;
(iv) the insertions are formed via epitaxial growth on a substrate misoriented from the zero-one-one crystallographic direction towards the "minus one"-"minus one"-"minus one" ($<\bar{1}\bar{1}\bar{1}>$) crystallographic direction by less than two degrees;
(v) the insertions are formed via epitaxial growth on a substrate misoriented from the zero-one-one crystallographic direction towards the one-one-one (<111>) crystallographic direction by at least two degrees;
(vi) the insertions are formed via epitaxial growth on a substrate misoriented from the zero-one-one crystallographic direction towards the "minus one"-"minus one"-"minus one" ($<\bar{1}\bar{1}\bar{1}>$) crystallographic direction by at least two degrees;
(vii) the insertions are formed as corrugated layers, and
(viii) the insertions are formed as three-dimensional islands.

11. The optoelectronic device of claim 1, wherein said substrate is formed of gallium arsenide.

12. The optoelectronic device of claim 1, wherein said feature is that the forbidden gap of the insertion exceeds one point nine electronVolts (1.9 eV).

13. The optoelectronic device of claim 1, wherein the forbidden gap of said insertion exceeds one point nine electronVolt (1.9 eV).

* * * * *